(12) United States Patent
Yamada et al.

(10) Patent No.: US 8,631,568 B2
(45) Date of Patent: Jan. 21, 2014

(54) PRINTED WIRING BOARD MANUFACTURING METHOD

(75) Inventors: Tetsuro Yamada, Kawasaki (JP); Takahiro Ooi, Kawasaki (JP); Yoshihiro Morita, Kawasaki (JP); Akiko Matsui, Kawasaki (JP); Misuhiko Sugane, Kawasaki (JP); Takahide Mukoyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 122 days.

(21) Appl. No.: 13/046,076

(22) Filed: Mar. 11, 2011

(65) Prior Publication Data

US 2011/0232949 A1 Sep. 29, 2011

(30) Foreign Application Priority Data

Mar. 29, 2010 (JP) .................................. 2010-75423

(51) Int. Cl.
*H05K 3/02* (2006.01)

(52) U.S. Cl.
USPC .................................. 29/846; 29/825; 29/852

(58) Field of Classification Search
USPC ........................................... 29/825, 846, 852
See application file for complete search history.

(56) References Cited

U.S. PATENT DOCUMENTS

| | | | | |
|---|---|---|---|---|
| 7,056,571 | B2 * | 6/2006 | Tomekawa et al. | 428/209 |
| 8,119,225 | B2 * | 2/2012 | Peng et al. | 428/209 |
| 2004/0142154 | A1 * | 7/2004 | Tomekawa et al. | 428/209 |
| 2004/0181764 | A1 | 9/2004 | Brist et al. | |
| 2005/0025967 | A1 * | 2/2005 | Lawton et al. | 428/375 |
| 2010/0116530 | A1 * | 5/2010 | Okazaki | 174/257 |

FOREIGN PATENT DOCUMENTS

| | | | |
|---|---|---|---|
| CN | 101494949 | * | 7/2009 |
| EP | 2 079 289 A2 | | 7/2009 |
| EP | 2 086 293 A1 | | 8/2009 |
| JP | 59-131170 U | | 9/1984 |
| JP | 03-206148 A | | 9/1991 |
| JP | 05039372 | | 2/1993 |
| JP | 11286847 | | 10/1999 |
| JP | 2004-221558 A | | 8/2004 |
| JP | 2006233369 | | 9/2006 |
| JP | 2009-164416 A | | 7/2009 |
| WO | 2007/109483 A1 | | 9/2007 |

OTHER PUBLICATIONS

European Search Report application No. 11158357.1 dated Jul. 4, 2011.
Office Action from EPO application No. 11 158 357.1 dated May 14, 2012.
Office Action mailed Nov. 19, 2013, issued in corresponding JP Patent Application No. 2010-075423 (with partial English translation).

* cited by examiner

*Primary Examiner* — Carl Arbes
(74) *Attorney, Agent, or Firm* — Squire Sanders (US) LLP

(57) ABSTRACT

A printed wiring board manufacturing method includes weaving a glass fiber cloth with warp and weft yarns such that the warp and weft yarns are visually distinguishable at least a region. The glass fiber cloth is impregnated with a resin to fabricate a substrate. A copper foil is formed on at least one surface of the substrate to fabricate a core substrate. The copper foil is removed within the region on the core substrate to form an opening. A pitch between the warp yarns or between the weft yarns which are presented in the opening is detected. A pitch between a pair of differential wirings to be patterned is determined based on the detected pitch between the warp yarns or between the weft yarns. The pair of differential wirings is patterned on the core substrate in accordance with the determined pitch between the pair of differential wirings.

8 Claims, 12 Drawing Sheets

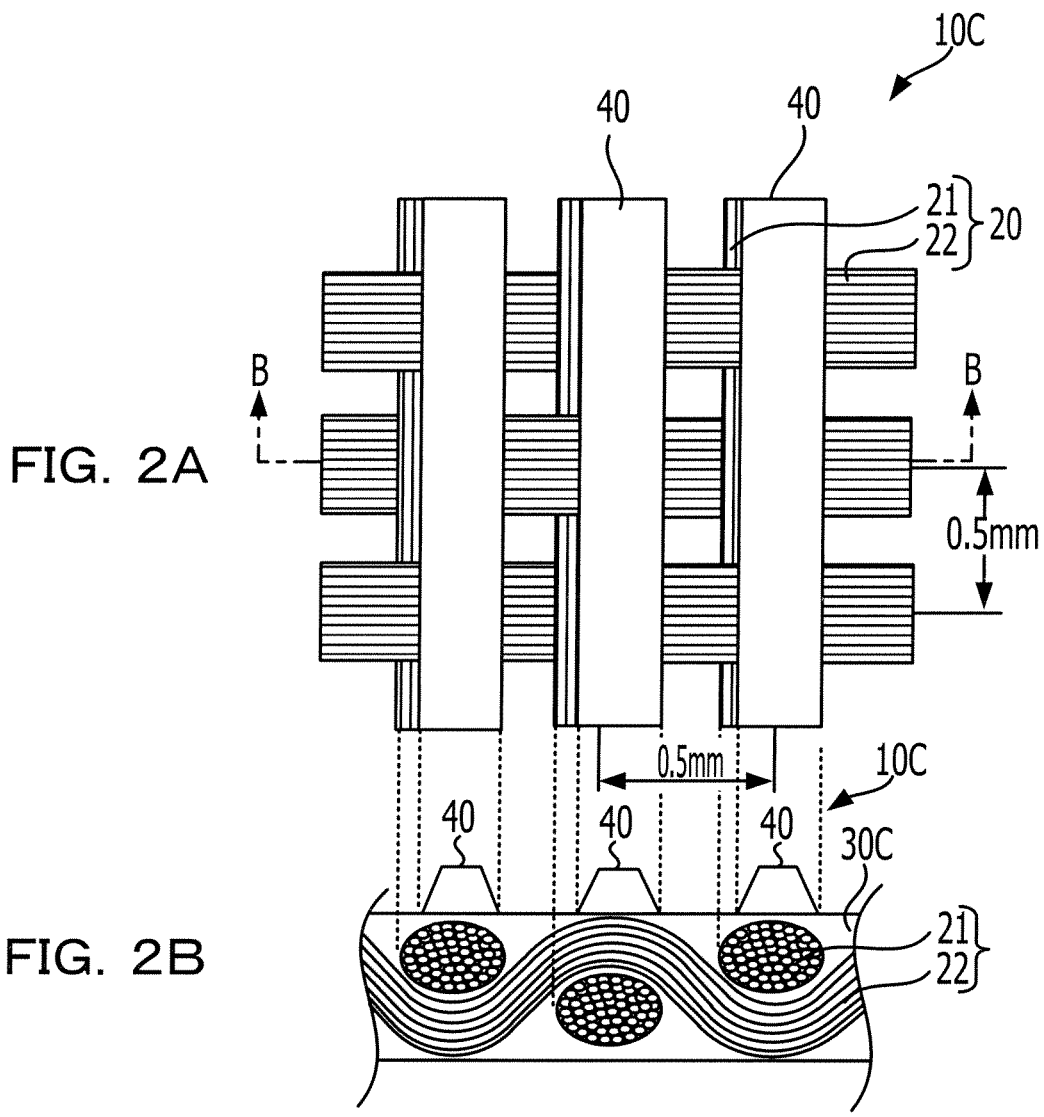

PRINTED WIRING BOARD MANUFACTURING METHOD

CROSS-REFERENCE TO RELATED APPLICATION

This application is based upon and claims the benefit of priority of Japanese Patent Application No. 2010-75423, filed on Mar. 29, 2010, the entire contents of which are incorporated herein by reference.

FIELD

Embodiments discussed herein are related to a printed wiring board manufacturing method and a printed wiring board.

BACKGROUND

Some printed wiring boards employ a core substrate on which a pair of differential signal wirings is patterned. When the core substrate is fabricated by impregnating a glass fiber cloth, made up of warp yarns and weft yarns, with a resin, a delay in signal transmission in the core substrate due to the positional relationship between projected/recessed positions of the glass fiber cloth and the differential signal wirings may not cause a significant problem at a transmission frequency of 1.6 GHz or below, for example.

Meanwhile, in a case where the transmission frequency increases up to a range of 3 to 5 GHz, a delay in signal transmission may be generated with a difference at a level that is not negligible, or an impedance mismatch may be caused. To cope with the difference in the delay time and the impedance mismatch, a technique has been proposed which provides, e.g., a structure for adjusting the positional relationship between the projected/recessed positions of the glass fiber cloth and the differential signal wirings with more consideration paid to the projected/recessed positions of the glass fiber cloth.

In the stage where a differential signal wiring pattern is drawn, however, the surface of the substrate is covered with a copper foil and the glass fiber cloth in the substrate cannot be visually recognized. Also, even in the substrate (prepreg) in the stage where the copper foil is not yet coated over the surface of the substrate, it is difficult to visually recognize individual yarns (warp yarns and weft yarns) of the glass fiber cloth for the reason that the glass fiber cloth is impregnated with the resin. Recently, spread-type glass fibers, i.e., glass fibers collapsed to spread yarns (each made of the glass fibers) laterally, have often been used. In the case of the substrate using the spread-type glass fibers, a basket hole, i.e., a gap between individual yarns of a glass fiber cloth, is so very small as to further increase a difficulty in visual recognition of the yarns. Stated another way, it has become more difficult to recognize the individual yarns of the glass fiber cloth one by one.

On the other hand, it has been proposed to change respective colors of warp yarns and weft yarns for the purposes of evaluating distortions of fibers or identifying the properties of the fibers. It has also been proposed to employ a reinforced fabric of a structure obtained by stacking two fabrics, each being made up of warp yarns and weft yarns and each having a front texture and a rear texture, in such a state that respective orientations of the front texture and the rear texture are turned upside down and the positional relationship between the warp yarns and the weft yarns are further reversed. However, an improvement in signal transmission is not taken into consideration at all. Similar structures to the above-described printed circuit board are disclosed in JP-A-5-39372, JP-A-11-286847, and JP-A-2006-233369, for example.

SUMMARY

According to an embodiment of the invention, a printed wiring board manufacturing method includes weaving a glass fiber cloth with warp and weft yarns such that the warp and weft yarns are visually distinguishable at least a region. The glass fiber cloth is impregnated with a resin to fabricate a substrate. A copper foil is formed on at least one surface of the substrate to fabricate a core substrate. The copper foil is removed within the region on the core substrate to form an opening. A pitch between the warp yarns or between the weft yarns which are presented in the opening is detected. A pitch between a pair of differential wirings to be patterned is determined based on the detected pitch between the warp yarns or between the weft yarns. The pair of differential wirings is patterned on the core substrate in accordance with the determined pitch between the pair of differential wirings.

It is to be understood that both the foregoing general description and the following detailed description are exemplary and explanatory, and are not restrictive of the invention.

BRIEF DESCRIPTION OF THE DRAWINGS

FIGS. 2A and 2B illustrate one example of a printed wiring board according to a first embodiment of the invention.

DESCRIPTION OF EMBODIMENTS

Hereinafter, embodiments the present invention of a printed wiring board manufacturing method and a printed wiring board will be described with reference to the drawings.

Figure 1A:
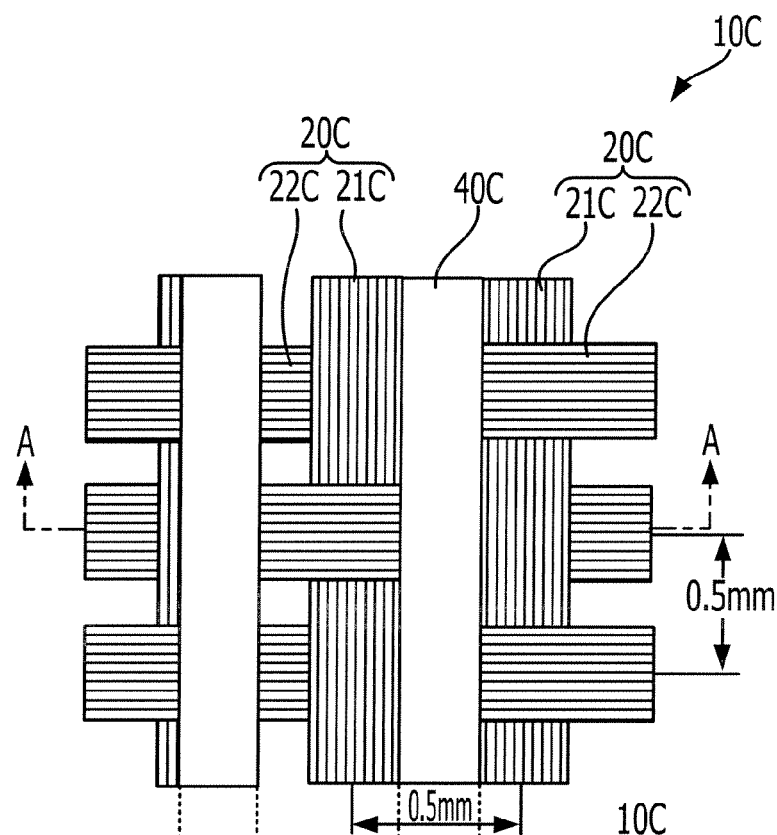
FIGS. 1A and 1B illustrate a printed wiring board as a comparative example.
Figure 1B:
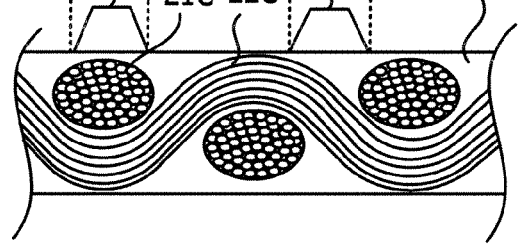

FIGS. 1A and 1B illustrate a printed wiring board as the comparative example. In FIGS. 1A and 1B, each reference number is suffixed with "C" to represent the comparative example in a discriminative manner.

FIG. 1A is a plan view of a printed wiring board 10C as the comparative example, and FIG. 1B is a sectional view taken along a line A-A in FIG. 1A as viewed in the direction denoted by arrow. It is noted that a resin plate including a glass fiber cloth impregnated with a resin is omitted in FIG. 1A.

The printed wiring board 10C includes a glass fiber cloth 20C that is obtained by weaving warp yarns 21C and weft yarns 22C into the form of a cloth, a resin plate 30C that is obtained by impregnating the glass fiber cloth 20C with a resin and hardening it after shaping into the form of a plate, and differential signal wirings 40C that are formed on the surface of the resin plate 30C.

The glass fiber cloth 20C constituting the printed wiring board 10C, illustrated in FIGS. 1A and 1B, has no special features. The warp yarns 21C and the weft yarns 22C of the glass fiber cloth 20C are made of the same material and have the same shape and the same color tone. Further, the warp yarns 21C and the weft yarns 22C are each formed by bundling a plurality of thin glass fibers or filaments into one yarn or strand. The pitch or spacing between two adjacent warp yarns 21C and the pitch between two adjacent weft yarns 22C are each about 0.5 mm, for example.

The differential signal wirings 40C, illustrated in FIGS. 1A and 1B, are extended parallel to the warp yarns 21C of the glass fiber cloth 20C, but the pitch between two adjacent differential signal wirings 40C is irrelevant to the pitch between two adjacent warp yarns 21C. In the illustrated comparative example, one of two differential signal wirings 40C is formed at a position substantially overlapping with one warp 21C, and the other wiring 40C is formed substantially at a midpoint between two adjacent warp yarns 21C.

In the printed wiring board 10C thus constructed, impedances of the two differential signal wirings 40C differ from each other depending on differences in properties of the glass fiber cloth 20C and the resin plate 30C, which are positioned right under those two differential signal wirings 40C. Therefore, delay times of signals transmitted through the two differential signal wirings 40C also differ from each other. When the frequency of the transmitted signal reaches a range as high as 3 to 5 GHz, for example, the difference in the signal delay time is increased to a level that is not negligible and may cause a failure in the circuit operation.

Embodiments of the invention will be described below in view of the comparative example described above.

FIGS. 2A and 2B illustrate one example of a printed wiring board according to a first embodiment of the invention.

FIG. 2A is a plan view and FIG. 2B is a sectional view taken along a line B-B in FIG. 2A as viewed in the direction denoted by arrow. It is noted that a resin plate is omitted in FIG. 2A.

A printed wiring board 10 according to the first embodiment can include, as in the printed wiring board 10C of FIG. 1, a glass fiber cloth 20 that is obtained by weaving warp yarns 21 and weft yarns 22 into the form of a cloth, a resin plate 30 that is obtained by impregnating the glass fiber cloth 20 with a resin and hardening it after shaping into the form of a plate, and differential signal wirings 40 that are formed on the surface of the resin plate 30.

The warp yarns 21 and the weft yarns 22 forming the glass fiber cloth 20, illustrated in FIG. 2, can be yarns made of the same resin and having the same shape. However, the warp yarns 21 and the weft yarns 22 can be made different colors. Further, the warp yarns 21 and the weft yarns 22 may each be formed by bundling a plurality of thin glass fibers or filaments into one yarn, i.e., a bundle of fibers. In an embodiment, the pitch (spacing) between two adjacent warp yarns 21 and the pitch between two adjacent weft yarns 22 are each about 0.5 mm, for example.

In one embodiment, the differential signal wirings 40, illustrated in FIGS. 2A and 2B, are extended parallel to the warp yarns 21 of the glass fiber cloth 20. Further, the pitch between two adjacent differential signal wirings 40 is the same as the pitch between two adjacent warp yarns 21. In FIGS. 2A and 2B, the differential signal wirings 40 are positioned substantially right above the warp yarns 21 in one-to-one relation. Accordingly, the differential signal wirings 40 are all affected substantially at the same level by the glass fiber cloth 20 and the resin plate 30, which are present under the differential signal wirings 40. As a result, impedances of all the differential signal wirings 40 are substantially the same and delay times in signal transmission through the differential signal wirings 40 are also substantially equal to each other. It is hence possible to suppress the occurrence of a failure in the circuit operation due to the difference in the signal delay time.

Figure 3:
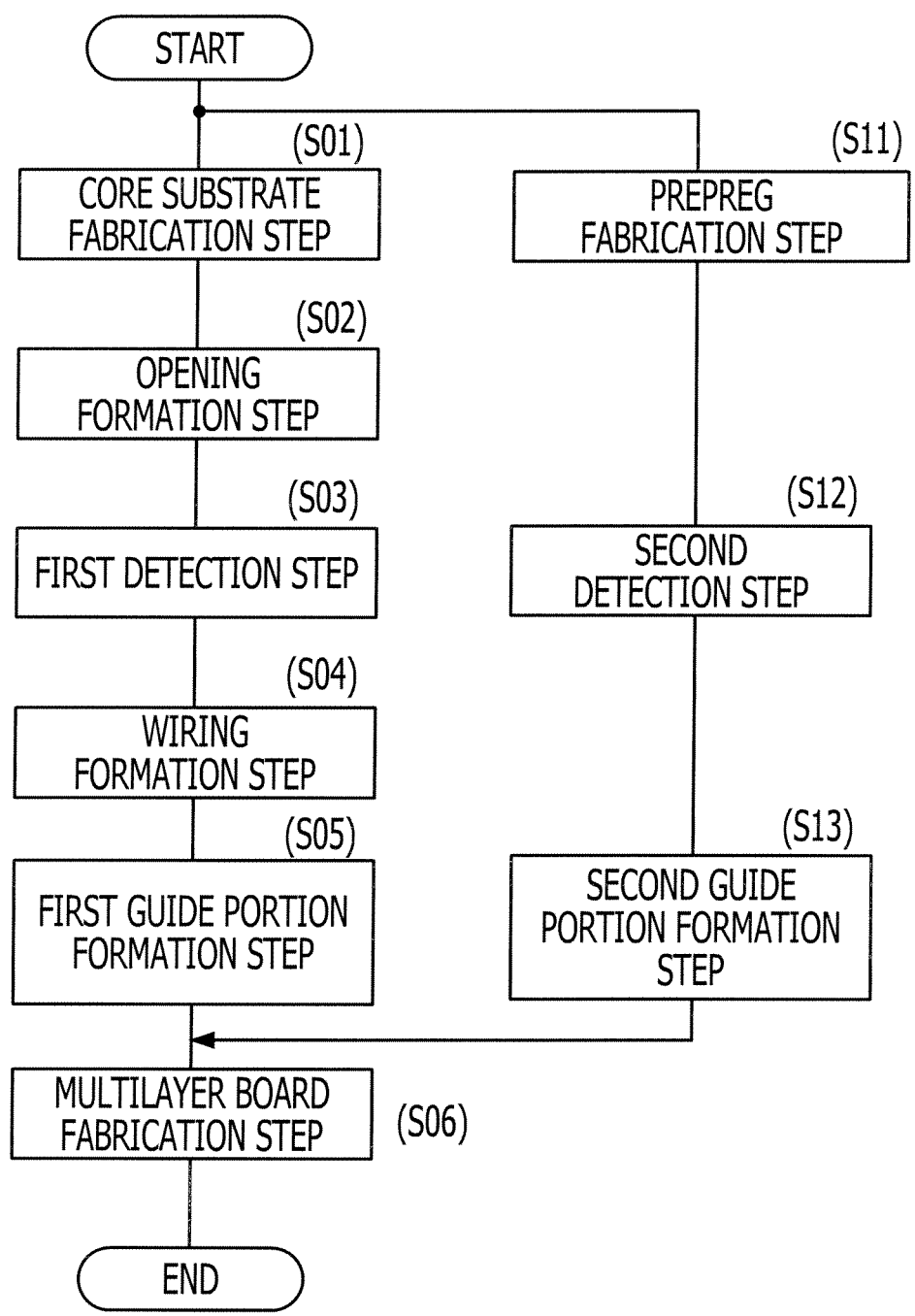
FIG. 3 is an example flowchart illustrating a printed wiring board manufacturing method according to a second embodiment of the invention.

FIG. 3 is an example flowchart illustrating a printed wiring board manufacturing method according to a second embodiment of the invention.

The printed wiring board manufacturing method, illustrated in FIG. 3, may include a core substrate fabrication step (S01), an opening formation step (S02), a first detection step (S03), a wiring formation step (S04), a first guide portion formation step (S05), and a multilayer board fabrication step (S06). The printed wiring board manufacturing method, illustrated in FIG. 3, may further include a prepreg fabrication step (S11), a second detection step (S12), and a second guide portion formation step (S13). In this embodiment, a step including both the core substrate fabrication step (S01) and the prepreg fabrication step (S11) corresponds to one example of a substrate fabrication step defined in the invention. Further, a step including both the first guide portion formation step (S05) and the second guide portion formation step (S13) corresponds to one example of a guide portion formation step defined in an embodiment of the invention.

In the core substrate fabrication step (S01), a plate-like substrate 51 (see FIG. 4A) is fabricated by impregnating a glass fiber cloth with a resin. The glass fiber cloth includes warp yarns and weft yarns made of yarns that are visually distinguishable from each other between the warp yarns and the weft yarns.

Figure 4A:
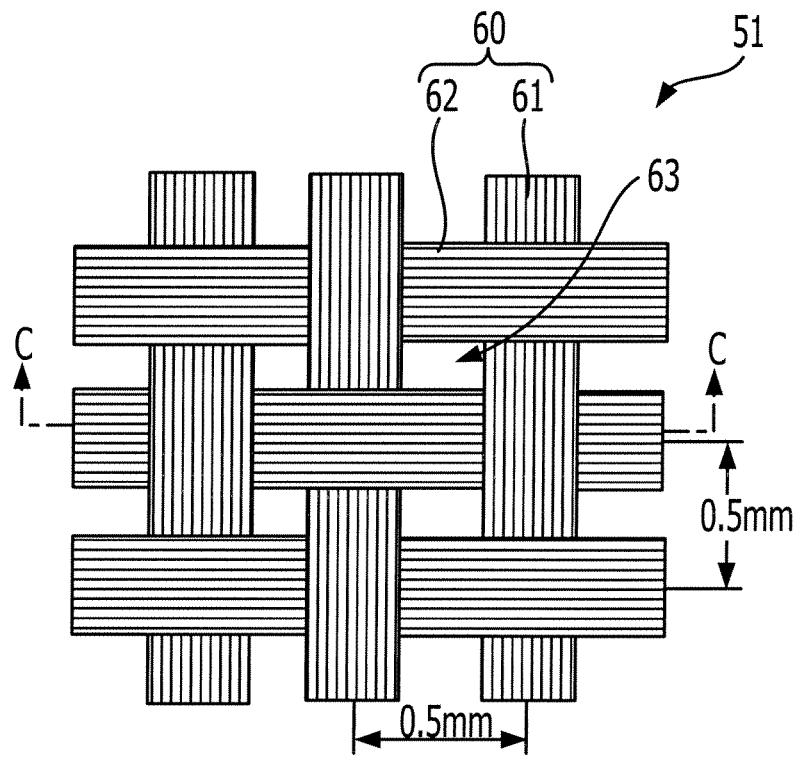
FIGS. 4A and 4B illustrate a substrate fabricated in a core substrate fabrication step.
Figure 4B:
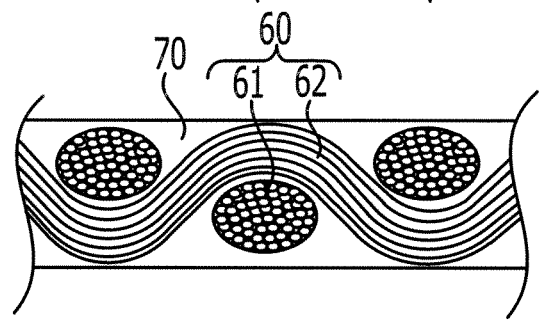

FIGS. 4A and 4B illustrate an example of the substrate 51 fabricated in the core substrate fabrication step (S01). FIG. 4A is a plan view and FIG. 4B is a sectional view taken along a line C-C in FIG. 4A as viewed in the direction denoted by arrow. It is noted that a resin plate is omitted in FIG. 4A.

The substrate 51 can include a glass fiber cloth 60 that is obtained by weaving warp yarns 61 and weft yarns 62 into the form of a cloth, and a resin plate 70 that is obtained by impregnating the glass fiber cloth 60 with a resin and hardening it after shaping into the form of a plate. A gap defined by two adjacent warp yarns 61 and two adjacent weft yarns 62 is called a basket hole 63.

The warp yarns 61 and the weft yarns 62 forming the glass fiber cloth 60, illustrated in FIGS. 4A and 4B, may be yarns made of the same material and having the same shape. Further, the warp yarns 61 and the weft yarns 62 can each be formed by bundling a plurality of thin glass fibers (filaments) into one yarn. However, the warp yarns 61 and the weft yarns 62 may be made different colors such that they are visually distinguishable from each other. In an embodiment, the pitch between two adjacent warp yarns 61 and the spacing between two adjacent weft yarns 62 are each about 0.5 mm, for example.

A method of manufacturing the substrate 51 can be similar to that known in the art except that the warp yarns 61 and the weft yarns 62 of the glass fiber cloth 60 are made in different colors. Hence, a detailed description of the manufacturing method is omitted here.

Figure 5A:
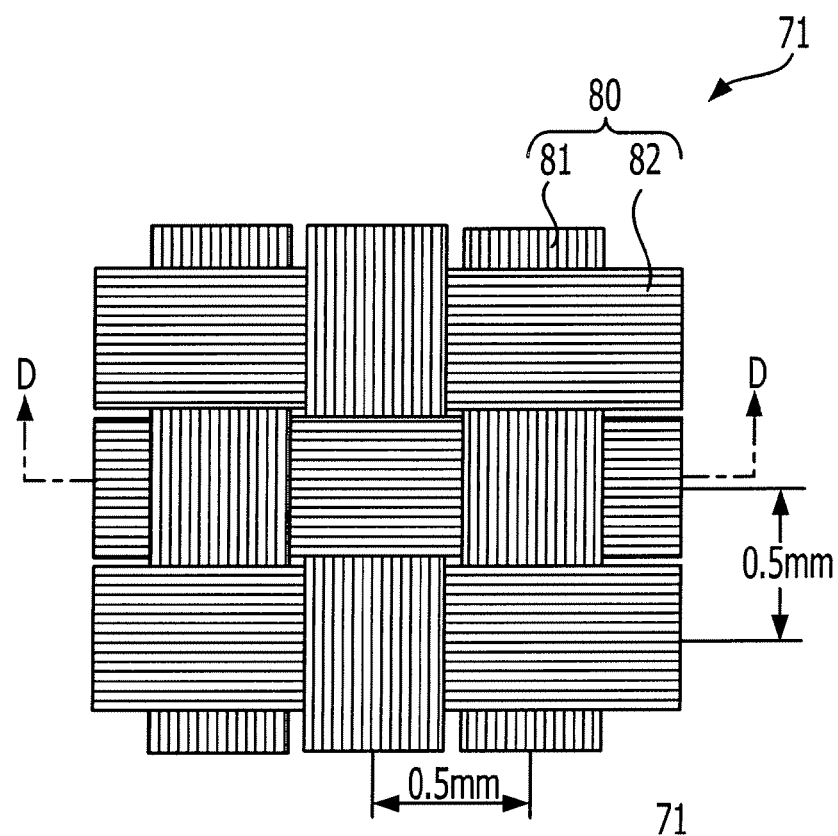
FIGS. 5A and 5B illustrate a modification of the substrate fabricated in the core substrate fabrication step.
Figure 5B:
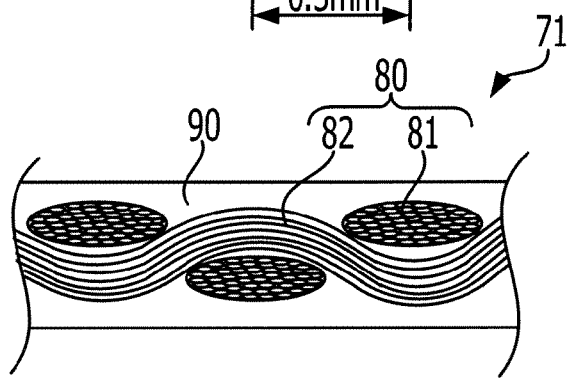

FIGS. 5A and 5B illustrate an example of a modification of the substrate fabricated in the core substrate fabrication step (S01). FIG. 5A is a plan view and FIG. 5B is a sectional view taken along a line D-D in FIG. 5A as viewed in the direction denoted by arrow.

The substrate 71 can include a glass fiber cloth 80 that is obtained by weaving warp yarns 81 and weft yarns 82 into the form of a cloth, and a resin plate 90 that is obtained by impregnating the glass fiber cloth 80 with a resin and hardening it after shaping into the form of a plate.

The warp yarns 81 and the weft yarns 82 forming the glass fiber cloth 80, illustrated in FIGS. 5A and 5B, may be yarns made of the same material and having the same shape. Further, the warp yarns 81 and the weft yarns 82 can each be formed by bundling a plurality of thin glass fibers (filaments) into one yarn. However, the warp yarns 81 and the weft yarns 82 can be made in different colors to be visually distinguishable from each other.

As illustrated in the example depicted in FIG. 5B, the glass fiber cloth 80 is made of spread-type glass fibers (yarns) which are each collapsed to spread laterally. Therefore, adjacent yarns are substantially contacted with each other and the basket hole 63, which are clearly presented in the ordinary-type glass fiber cloth illustrated in FIGS. 4A and 4B, is hardly formed.

Stated another way, in the case of the glass fiber cloth 80 using the spread-type glass fibers, the basket hole is not formed in a sufficient size. Therefore, if glass fibers having the same features, including a color tone, are used as the warp yarns 81 and the weft yarns 82, it is more difficult to visually distinguish individual yarns one by one in comparison with the case of the glass fiber cloth using the ordinary-type glass fibers. In this embodiment, however, since the warp yarns 81 and the weft yarns 82 are made of different colored yarns, the individual yarns of the warp yarns 81 and the weft yarns 82 can be visually distinguished one by one with ease.

A method of manufacturing the substrate 71, illustrated in FIGS. 5A and 5B, may be similar to that known in the art except that the warp yarns 81 and the weft yarns 82 of the glass fiber cloth 80 are made to be different colors. Hence, a detailed description of the manufacturing method is omitted here.

The following description is continued assuming that the substrate 51 having the shape illustrated in FIGS. 4A and 4B has been fabricated in the core substrate fabrication step (S01) of FIG. 3.

In the core substrate fabrication step (S01) of FIG. 3, a plate-like core substrate 50 (see FIG. 6) is further fabricated by forming a copper foil over the surface (on each of both sides) of the substrate 51 (see FIG. 4), which has been fabricated as described above.

Figure 6:
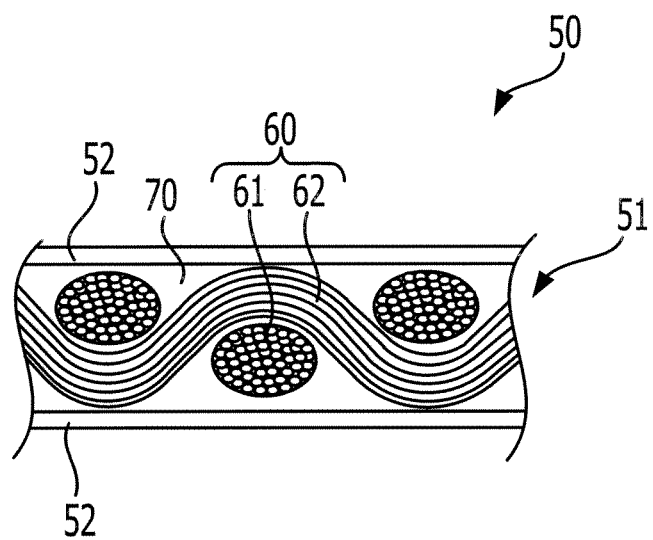
FIG. 6 is a sectional view of a core substrate.

FIG. 6 is an example of a sectional view of the core substrate 50.

The core substrate 50 can include the substrate 51, which is illustrated in FIG. 4 as well, and copper foils 52 formed on both the surfaces of the substrate 51.

A method of manufacturing the core substrate 50 may be similar to that known in the art except that the warp yarns 61 and the weft yarns 62 of the glass fiber cloth 60 forming the substrate 51 are made to be different colors. Hence, a detailed description of the manufacturing method is omitted here.

After the core substrate 50 has been fabricated in the core substrate fabrication step (S01) of FIG. 3, the opening formation step (S02) is executed.

Figure 7:
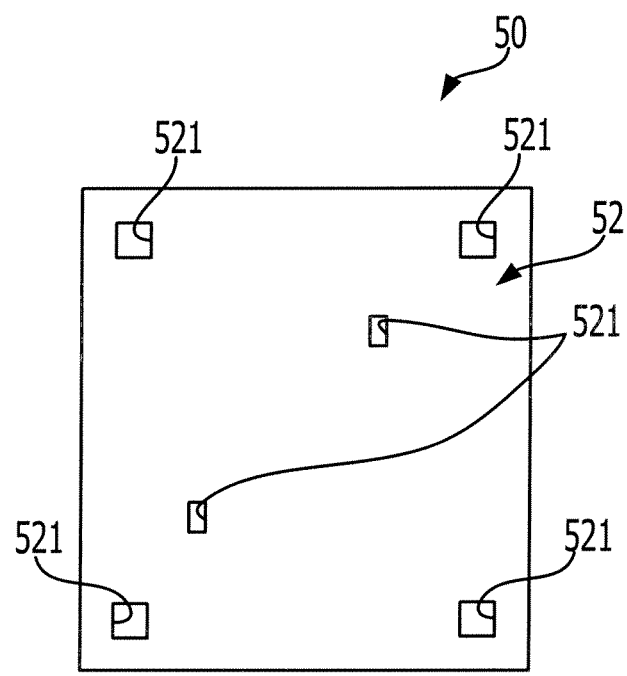
FIG. 7 is a plan view illustrating the core substrate in the state after openings have been formed therein.
Figure 8:
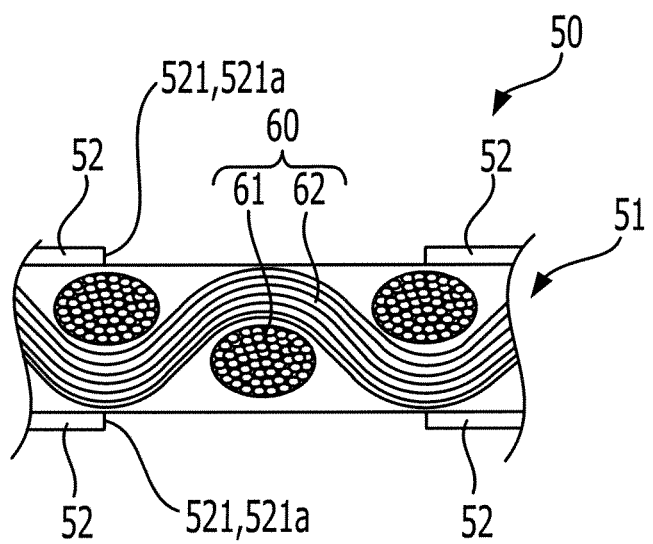
FIG. 8 is a sectional view illustrating one opening in the core substrate in the state after the openings have been formed therein.

FIG. 7 is a plan view illustrating the core substrate in the state after openings have been formed therein, according to an embodiment. FIG. 8 is a sectional view illustrating one opening in the core substrate in the state after the openings have been formed therein, according to an embodiment.

In FIG. 7, openings 521 may be formed near four corners in the surface of the core substrate 50 and near regions where the differential signal wirings are formed as described later, by removing the copper foil 52. The openings 521 can be formed in a similar process to that executed when forming the differential signal wirings on the core substrate 50. More specifically, in one embodiment, the openings 521 are formed through the steps of coating a photoresist over the core substrate 50, irradiating the photoresist with light to remove the photoresist only in its regions where the openings 521 are to be formed, and removing not only the photoresist in its regions right above the openings 521, but also the copper foil 52 in its regions right under the openings 521 by etching. With the steps described above, the openings 521 in each of which the copper foil 52 is removed are formed. Thus, the glass fiber cloth 60 can be visually recognized inside the resin plate 70 through the openings 521.

Here, as illustrated in FIG. 8, the openings 521 are formed in both the surfaces of the core substrate 50. Of the openings 521, openings 521a formed on the first surface side can be used to fabricate the differential signal wirings on a first surface of the core substrate 50, and openings 521b formed on the second surface side can be used to fabricate the differential signal wirings on a second surface of the core substrate 50. In this embodiment, the openings 521a in the first surface and the openings 521b in the second surface are formed at the same positions in both the surfaces near the four corners illustrated in FIG. 7, while the openings 521a and 521b formed in inner regions of both the surfaces are positioned differently between the first surface and the second surface of the core substrate 50. The reason is that regions where the differential signal wirings are to be formed differ between the first surface and the second surface of the core substrate 50, the openings 521a are formed in the first surface near the differential signal wirings which are to be formed in the first surface, and the openings 521b are formed in the second surface near the differential signal wirings which are to be formed in the second surface.

While FIG. 7 illustrates the openings 521 each having a rectangular shape, the openings 521 are not always required to be rectangular, and they may have a circular or some other suitable shape. However, the openings 521 are each preferably formed to be a size that is enough to make two or more warp yarns and two or more weft yarns exposed through the opening for the purpose of exactly recognizing the positions where the warp yarns and the weft yarns are arranged.

Figure 9:
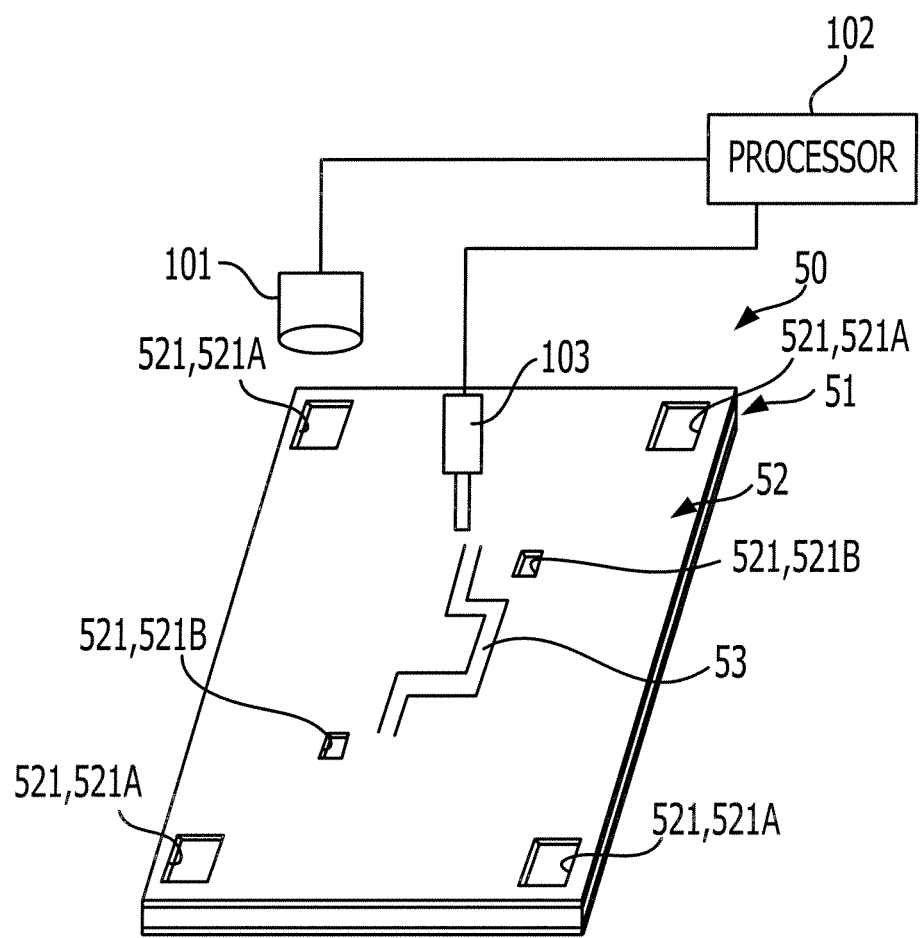
FIG. 9 is an illustration to explain a first detection step and part of a subsequent wiring formation step.

Further, while the openings 521 are formed in both the surfaces of the core substrate 50 in this embodiment as illustrated in FIG. 8, the openings 521 may be formed only in one surface of the core substrate 50, such as when the differential signal wirings are formed only on one surface of the core substrate 50, or when two units of later-described laser drawing machine 103, illustrated in FIG. 9, are disposed on both the sides of the core substrate 50 in oppositely facing relation.

After the opening formation step (S02) illustrated in FIG. 3 is completed as described above, the first detection step (S03) is executed.

FIG. 9 is an illustration to explain the first detection step (S03) and part of the subsequent wiring formation step (S04).

When the differential signal wirings are formed, a photoresist may be coated over the surface of the core substrate 50 as in the step of forming the openings 521. However, the photoresist is omitted in FIG. 9. Also, a method of forming the differential signal wirings may be similar to that known in the art, and hence a detailed description of the method of forming the differential signal wirings is omitted here.

FIG. 9 illustrates, in addition to the core substrate 50 having the openings 521 formed therein, an image recognition camera 101, a processor 102, and a laser drawing machine 103.

The image recognition camera 101 is relatively movable with respect to the core substrate 50 such that it can look into each of the openings 521 formed in the core substrate 50. Further, the image recognition camera 101 picks up an image of the warp yarns 61 and the weft yarns 62 of the glass fiber cloth 60 (see FIG. 8) and sends an image signal to the processor 102.

The processor 102 analyzes the picked-up image based on the image signal received from the image recognition camera 101, to thereby detect the arranged positions of the warp yarns 61 and the weft yarns 62, which is presented in the opening 521. The processor 102 further recognizes, based on the arranged positions of the warp yarns 61 and the weft yarns 62 presented in the opening 521, the arranged positions of the warp yarns 61 and the weft yarns 62 in the region where the differential signal wirings are to be formed.

The laser drawing machine 103 is also relatively movable with respect to the core substrate 50 under control by the processor 102.

The processor 102 recognizes the arranged positions of the warp yarns 61 and the weft yarns 62 over an entire region of the core substrate 50 based on images picked up by the image recognition camera 101 when looking into openings 521A, which are formed near the four corners of the core substrate 50. Further, regarding the regions where the differential signal wirings are to be formed, the processor 102 corrects the recognized results of the arranged positions of the warp yarns 61 and the weft yarns 62 based on images picked up by the image recognition camera 101 when looking into openings 521B, which are formed near the regions where the differential signal wirings are to be formed. Thus, in this embodiment, since the arranged positions of the warp yarns 61 and the weft yarns 62 are recognized based on the images picked up by the image recognition camera 101 when looking into the openings 521B, which are formed near the regions where the differential signal wirings are to be formed, the arranged positions of the warp yarns 61 and the weft yarns 62 can be more exactly recognized.

In this embodiment, a process of detecting the arranged positions of the warp yarns 61 and the weft yarns 62 of the core substrate 50 by using both the image recognition camera 101 and the processor 102 corresponds to the first detection step (S03) illustrated in FIG. 3.

After detecting and recognizing the arranged positions of the warp yarns 61 and the weft yarns 62, the processor 102 drives the laser drawing machine 103. More specifically, the processor 102 moves the laser drawing machine 103 to a position corresponding to the differential signal wiring that is going to be formed, and operates the laser drawing machine 103 to emit a laser beam. With the aid of the laser beam emitted, the laser drawing machine 103 draws a pattern 53, which serves to form the differential signal wiring, at a location where the positional relationship relative to the warp yarns 61 and the weft yarns 62 becomes a predetermined positional relationship.

In this embodiment, a process of drawing the pattern 53, which serves to form the differential signal wiring, through the movement of the laser drawing machine 103 by the processor 102 and through the operation of the laser drawing machine 103 corresponds to part of the wiring formation step (S04) illustrated in FIG. 3. In the wiring formation step (S04), after the pattern 51 has been drawn by the laser drawing machine 103, the differential signal wirings are formed on the core substrate 50 by etching, for example, in a similar manner to that known in the art.

Although, in FIG. 3, the first guide portion formation step (S05) is illustrated following the wiring formation step (S04), the first guide portion formation step (S05) is described together with a later description of the second guide portion formation step (S13). Apart from the core substrate 50, a prepreg is described here.

The prepreg is a plate-like member that is sandwiched between two core substrates when the printed wiring board is fabricated in multiple layers. Though not illustrated, the prepreg is, for example, a resin plate obtained by impregnating a glass fiber cloth, which is prepared by weaving warp yarns and weft yarns into the form of a cloth, with a resin and hardening it after shaping into the form of a plate, similarly to each of the substrate bodies 51 and 71 illustrated in FIGS. 4 and 5. Also in the prepreg, the warp yarns and the weft yarns forming the glass fiber cloth are made of yarns colored in different colors as in the core substrate 50.

In the prepreg fabrication step (S11) of FIG. 3, the prepreg is fabricated. In this embodiment, as described above, the step including both the core substrate fabrication step (S01) and the prepreg fabrication step (S11) corresponds to one example of the substrate fabrication step defined in the invention.

In the second detection step (S12) of FIG. 3, though not illustrated, the arranged positions of the warp yarns and the weft yarns of the glass fiber cloth in the prepreg are recognized by the image recognition camera 101 and the processor 102 as in the case of the core substrate 50 illustrated in FIG. 9. In the case of the prepreg, however, because the copper foil 52 is not formed on the prepreg, the openings are not required to be formed unlike the case of the core substrate 50 illustrated in FIG. 9.

The second guide portion formation step (S13) illustrated in FIG. 3 will be described below together with the first guide portion formation step (S05). As described above, the step including both the first guide portion formation step (S05) and the second guide portion formation step (S13) corresponds to one example of the guide portion formation step defined in the invention.

In the first guide portion formation step (S05) and the second guide portion formation step (S13), guide holes for alignment (positioning) are formed in both the core substrate 50 and the prepreg in accordance with the arranged positions of the warp yarns and the weft yarns of the core substrate 50 and the prepreg, which have been recognized by the image recognition camera 101 and the processor 102 as described above. Herein, however, because relative alignment between the core substrate 50 and the prepreg is just needed, the first guide portion formation step (S05) or the second guide portion formation step (S13) is not necessarily required to be executed in the sequence illustrated in FIG. 3.

More specifically, the sequence may be modified such that guide holes are formed in one of the core substrate 50 and the prepreg (or one of all plates when the core substrate 50 and the prepreg are present three or more in total) before confirming the arranged positions of the warp yarns and the weft yarns, and guide holes are formed in the remaining one or more plates at positions, which are aligned with the guide holes formed in the other of the core substrate 50 and the prepreg (or the one plate) before confirming the arranged positions of the warp yarns and the weft yarns, after confirming the arranged positions of the warp yarns and the weft yarns in the remaining one or more plates.

Figure 10:
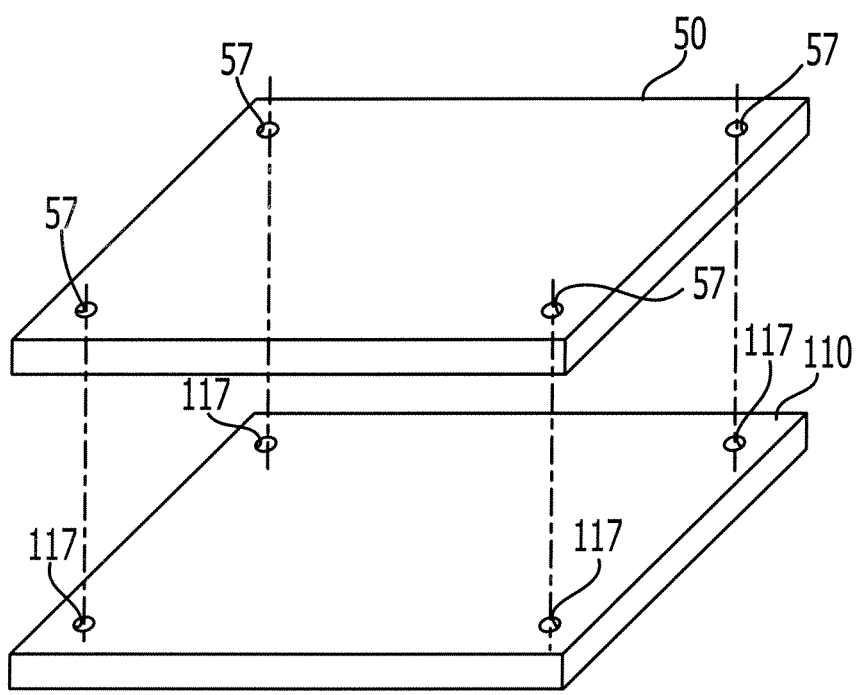
FIG. 10 is a perspective view illustrating the core substrate and a prepreg in each of which guide holes are formed.

FIG. 10 is a perspective view illustrating an example of the core substrate and the prepreg in each of which guide holes are formed.

In the first guide portion formation step (S05) and the second guide portion formation step (S13) of FIG. 3, guide holes 57 can be formed in the core substrate 50 and guide holes 117 are formed in a prepreg 110. Those guide holes 57 and 117 may be formed such that, when the guide holes 57 and 117 are aligned with each other, the arranged positions of the warp yarns and the weft yarns of the respective glass fiber cloths forming the core substrate 50 and the prepreg 110 are also aligned with each other between the core substrate 50 and the prepreg 110.

The formation of the guide holes 57 and 117 has been performed in the past, and the first guide portion formation step (S05) and the second guide portion formation step (S13) of FIG. 3 may differ from the known steps in a point of aligning the guide holes as described above. Hence, a description of practical methods of forming the guide holes 57 and 117 is omitted here.

While this embodiment has been described above in connection with the case of forming the guide holes 57 and 117, a guide portion defined in an embodiment of the invention is not always required to be a guide hole and it may be, for example, a notch formed in a lateral surface of the core substrate 50 or the prepreg 110.

Alternatively, the guide portion may be a mark enabling the arranged positions of the warp yarns and the weft yarns to be aligned between the core substrate 50 and the prepreg 110 when the core substrate 50 and the prepreg 110 are stacked one above the other. However, the following description is continued on condition that the guide holes 57 and 117 are formed as the guide portions.

When a multilayer printed wiring board is fabricated as described later, a relative lateral shift may occur between the core substrate and the prepreg due to influences of pressure and heat that are applied in a process of fabricating the multilayer printed wiring board. In such a case, it is preferable to confirm the amount of the lateral shift in advance and to form the guide portions, e.g., the guide holes, at positions shifted in a direction opposite to the direction of the lateral shift by the same amount so that the arranged positions of the warp yarns and the weft yarns of the glass fiber cloths are aligned between the core substrate and the prepreg after the multilayer printed wiring board has been fabricated. However, the following description is made on condition that the lateral shift does not occur.

After the end of both the first guide portion formation step (S05) and the second guide portion formation step (S13) illustrated in FIG. 3, the multilayer board fabrication step (S06) is executed.

Figure 11:
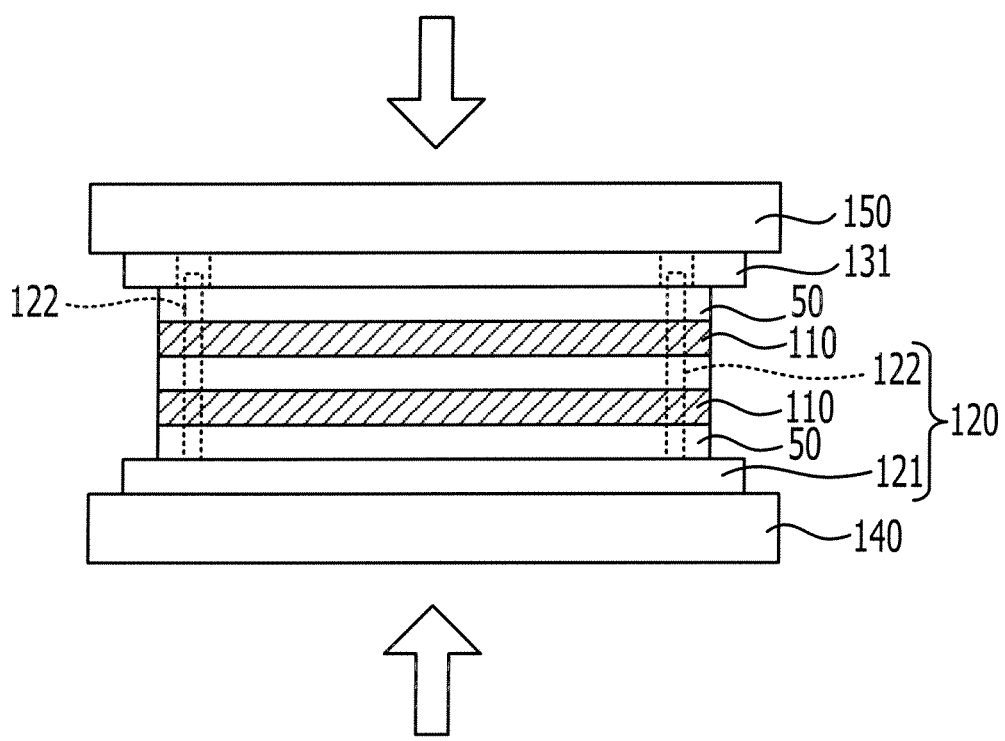
FIG. 11 is an explanatory view to explain a multilayer board fabrication step.

FIG. 11 is an explanatory view to explain the multilayer board fabrication step (S06).

The core substrate 50 used herein may be one obtained in the stage after the wiring formation step (S04) and the first guide portion formation step (S05) illustrated in FIG. 3, and the prepreg 110 used herein may be one obtained in the stage after the second guide portion formation step (S13). Further, as illustrated in FIG. 11, a guide member 120 including a metal plate 121 and guide rods 122 vertically mounted to the metal plate 121 is prepared.

The guide holes 57 and 117 (see FIG. 10) are formed in the core substrate 50 and the prepreg 110 at positions corresponding respectively to the guide rods 122 of the guide member 120.

In the multilayer plate fabrication step (S06), the core substrates 50 and the prepregs 110 are inserted through the guide rods 122 of the guide member 120 and alternately stacked such that the prepreg 110 is sandwiched between two core substrates 50. FIG. 11 illustrates an example in which three core substrates 50 and two prepregs 110 are stacked. In the state where the core substrates 50 and the prepregs 110 are inserted through the guide rods 122, the arranged positions of the warp yarns and the weft yarns of respective glass fiber cloths forming the core substrates 50 and the prepregs 110 are aligned for all the plates as a result of adjusting the positions where the guide holes 57 and 117 are formed.

Another metal plate 131 is placed on a multilayer assembly made up of the core substrates 50 and the prepregs 110 which are stacked as described above. Further, the multilayer assembly sandwiched between the two metal plates 121 and 131 is placed on a pressure plate 140 including a built-in heater, and another pressure plate 150 including a built-in heater is placed on the multilayer assembly. Then, the multilayer assembly is pressed under heating from above and below through the two pressure plates 140 and 150. As a result, the resin is softened to such an extent that the core substrates 50 and the prepregs 110 are integrated with each other, thereby providing the multilayer printed wiring board in which wiring layers are formed within the board.

Figure 12:
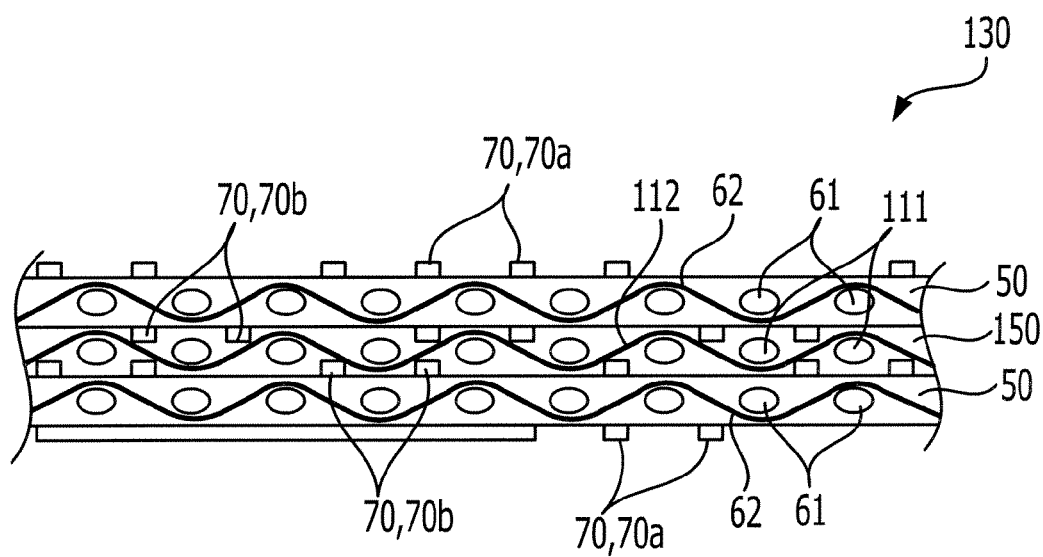
FIG. 12 is a sectional view of a printed wiring board according to the second embodiment of the invention.

FIG. 12 is a sectional view of the printed wiring board, which has been fabricated through the above-described steps, according to the second embodiment of the invention. While FIG. 11 illustrates one exemplary structure including five plates, i.e., three core substrates 50 and two prepregs 110, FIG. 12 illustrates another exemplary structure including three plates, i.e., two core substrates 50 and one prepreg 110 sandwiched between the two core substrates 50, for the sake of simplicity of the drawing.

A multilayer printed wiring board 130, illustrated in FIG. 12, is a printed wiring board that is obtained by integrating two core substrates 50 and one prepreg 110 with each other under heating and pressure.

In the multilayer printed wiring board 130 illustrated in FIG. 12, the arranged positions of the warp yarns 61 and 111 of respective glass fiber cloths forming the two core substrates 50 and the one prepreg 110 are all aligned with one another. Though not illustrated in FIG. 12, the arranged positions of the weft yarns 62 and 112 thereof are also all aligned with one another.

Differential signal wirings 70 formed in the multilayer printed wiring board 130 can include differential signal wirings 70a formed on outer surfaces of the multilayer printed wiring board 130 and differential signal wirings 70b formed on inner surfaces of the multilayer printed wiring board 130, and positions of those differential signal wirings 70a and 70b can be aligned in relation to warp yarns and weft yarns forming multilayer glass fiber cloths.

While the above description is made, for the sake of easier understanding, in connection with the case of aligning the positions of all the differential signal wirings 70 in relation to the warp yarns and the weft yarns, all the differential signal wirings are not always required to be aligned in their positions. It is sufficient that the positions of the differential signal wirings are aligned for only the differential signal wirings of which impedances, for example, need to be held uniform with high reliability, such as when the positional relationships with respect to warp yarns and weft yarns of glass fiber cloths have to be aligned between two differential signal wirings for transmitting high-frequency differential signals.

Further, the foregoing embodiments are described on the premise that the warp yarns and the weft yarns forming the glass fiber cloth are colored over the entire surfaces of the core substrate(s) and the prepreg(s). However, the warp yarns and the weft yarns forming the glass fiber cloth may be colored only in partial regions, such as regions of the core substrate where the openings are formed and regions of the prepreg, which correspond to the openings in the core substrates.

While the foregoing embodiments are described as coloring all the warp yarns and the weft yarns, the warp yarns and the weft yarns may be colored intermittently, namely one or two yarns apart, for respective yarns of the warp yarns and the weft yarns. In other words, it is just required that the warp yarns and the weft yarns are colored to be able to detect the arranged positions of the warp yarns and the weft yarns by analyzing the image picked up the image recognition camera 101 illustrated in FIG. 9.

In addition, individual yarns of the warp yarns and the weft yarns are just required to be visually distinguishable therebetween. Accordingly, features enabling the warp yarns and the weft yarns to be visually distinguishable are not limited to the difference in color. Thus, the warp yarns and the weft yarns may be visually distinguishable from each other based on the difference in, e.g., shade or the intensity of fluorescence.

The printed wiring board 10 (see FIG. 2) according to the first embodiment and the multilayer printed wiring board 130 (see FIG. 12) and the printed wiring board manufacturing method (see FIG. 3) both according to the second embodiment, described above, can provide the printed wiring boards which include differential signal wirings formed so as to provide higher uniformity in impedance and transmission delay time, and which are more suitable for high-speed signal transmission.

All examples and conditional language recited herein are intended for pedagogical objects to aid the reader in understanding the invention and the concepts contributed by the inventors to further the art, and are to be construed as being without limitation to such specifically recited examples and conditions, nor does the organization of such examples in the specification relate to a showing of the superiority and inferiority of the invention. Although the embodiments of the invention have been described in detail, it will be understood by those of ordinary skill in the relevant art that various changes, substitutions, and alterations could be made hereto without departing from the spirit and scope of the invention as set forth in the claims.

What is claimed is:

1. A printed wiring board manufacturing method, comprising:
    weaving a glass fiber cloth with warp yarns and weft yarns such that the warp yarns and the weft yarns are visually distinguishable at least a region;
    impregnating the glass fiber cloth with a resin to fabricate a substrate;
    forming a copper foil on at least one surface of the substrate to fabricate a core substrate;
    removing the copper foil within the region on the core substrate to form an opening;
    detecting a pitch between the warp yarns or between the weft yarns presented in the opening;
    determining a pitch between a pair of differential wirings to be patterned based on the detected pitch between the warp yarns or between the weft yarns; and
    patterning the pair of differential wirings on the core substrate in accordance with the determined pitch between the pair of differential wirings.

2. The method according to claim 1, wherein the detecting of the pitch between the warp yarns or between the weft yarns presented in the opening comprises detecting the pitch with image recognition.

3. The method according to claim 1, wherein the determining of the pitch between a pair of differential wirings to be patterned comprises determining the pitch to be set equal to an integral multiple of the detected pitch between the warp yarns or between the weft yarns.

4. The method according to claim 1, further comprising forming the warp yarns and the weft yarns to differ in at least one of a color tone, a shade, and intensity of fluorescence.

5. The method according to claim 1, wherein the removing comprises removing the copper foil within the region on the core substrate to form the opening in the vicinity of the pair of differential wirings to be patterned.

6. The method according to claim 1, wherein the removing comprises removing the copper foil within the region on the core substrate to form the opening on a corner portion of the core substrate.

7. The method according to claim 6, further comprising:
    weaving another glass fiber cloth with warp yarns and weft yarns such that the warp yarns and the weft yarns are visually distinguishable;
    impregnating said another glass fiber cloth with a resin to fabricate a prepreg;
    forming a guide portion at a position in the prepreg corresponding to the opening on the core substrate; and
    stacking the prepreg on the core substrate such that the guide portion of the prepreg is aligned with the opening of the core substrate.

8. The method according to claim 7, further comprising forming the guide portion of a hole in the prepreg.

* * * * *